(12) United States Patent
Zhang et al.

(10) Patent No.: US 11,313,774 B2
(45) Date of Patent: Apr. 26, 2022

(54) TEM ELECTROMECHANICAL IN-SITU TESTING METHOD OF ONE-DIMENSIONAL MATERIALS

(71) Applicant: DALIAN UNIVERSITY OF TECHNOLOGY, Dalian (CN)

(72) Inventors: Zhenyu Zhang, Dalian (CN); Junfeng Cui, Dalian (CN); Leilei Chen, Dalian (CN); Bo Wang, Dalian (CN); Dongming Guo, Dalian (CN)

(73) Assignee: DALIAN UNIVERSITY OF TECHNOLOGY, Dalian (CN)

( * ) Notice: Subject to any disclaimer, the term of this patent is extended or adjusted under 35 U.S.C. 154(b) by 388 days.

(21) Appl. No.: 16/620,210

(22) PCT Filed: Jul. 16, 2018

(86) PCT No.: PCT/CN2018/095793
§ 371 (c)(1),
(2) Date: Dec. 6, 2019

(87) PCT Pub. No.: WO2019/200760
PCT Pub. Date: Oct. 24, 2019

(65) Prior Publication Data
US 2020/0132574 A1    Apr. 30, 2020

(30) Foreign Application Priority Data

Apr. 28, 2018    (CN) .......................... 201810375892.1

(51) Int. Cl.
*G01N 3/08*    (2006.01)
*G01N 3/20*    (2006.01)
(Continued)

(52) U.S. Cl.
CPC ................. *G01N 3/08* (2013.01); *G01N 1/31* (2013.01); *G01N 1/38* (2013.01); *G01N 3/20* (2013.01);
(Continued)

(58) Field of Classification Search
None
See application file for complete search history.

(56) References Cited

U.S. PATENT DOCUMENTS

2014/0013854 A1    1/2014 Kang et al.

FOREIGN PATENT DOCUMENTS

| CN | 1815180 A | 8/2006 |
|----|-----------|--------|
| CN | 1995962 A | 7/2007 |

(Continued)

*Primary Examiner* — Michael J Logie
(74) *Attorney, Agent, or Firm* — Muncy, Geissler, Olds & Lowe, P.C.

(57) ABSTRACT

A TEM electromechanical in-situ testing method of one-dimensional materials is provided. A multi-function sample stage which can compress, buckle and bend samples is designed and manufactured. A carbon film on a TEM grid of Cu is eliminated, and the TEM grid of Cu is cut in half through the center of the circle. The samples are dispersed ultrasonically in alcohol and dropped on the edge of the semicircular grid of Cu with a pipette. A single sample is fixed on the edge of a substrate of the sample stage with conductive silver epoxy by using a micromechanical device under an optical microscope, and conductive silver paint is applied to the surface of the substrate of the sample stage; and an electromechanical in-situ testing is conducted in a TEM. This provides a simple and efficient sample preparation and testing method for a TEM electromechanical in-situ observing experiment.

1 Claim, 5 Drawing Sheets

(51) Int. Cl.
*G01N 1/31* (2006.01)
*G01N 1/38* (2006.01)
*G01N 23/04* (2018.01)
*H01J 37/26* (2006.01)
*G01N 1/30* (2006.01)

(52) U.S. Cl.
CPC ............ *G01N 23/04* (2013.01); *H01J 37/261* (2013.01); *G01N 2001/305* (2013.01); *G01N 2203/0019* (2013.01); *G01N 2203/0023* (2013.01); *H01J 2237/2802* (2013.01)

(56) References Cited

FOREIGN PATENT DOCUMENTS

| | | | | | |
|---|---|---|---|---|---|
| CN | 1995963 | A | | 7/2007 | |
| CN | 103743608 | A | | 4/2014 | |
| CN | 107219243 | A | * | 9/2017 | ............... G01N 1/28 |
| CN | 107219243 | A | | 9/2017 | |
| CN | 108896365 | A | * | 11/2018 | ............... G01N 1/28 |

\* cited by examiner

TEM ELECTROMECHANICAL IN-SITU TESTING METHOD OF ONE-DIMENSIONAL MATERIALS

TECHNICAL FIELD

The present invention relates to a TEM electromechanical in-situ testing method of one-dimensional materials, particularly relates to an in-situ nanomechanical electromechanical testing of one-dimensional materials, and belongs to the field of TEM in-situ nanomechanical testing.

BACKGROUND

With the construction and development of major national projects such as aviation, aerospace and deep space exploration, a series of high requirements are proposed for the performance of high-performance equipment. The performance of the high-performance equipment depends on the performance of high-performance parts. Generally, the surface is required to achieve sub-nanoscale surface roughness and nanoscale flatness, and no surface/sub-surface damage. A traditional processing method is difficult to meet the requirements, and the generated surface/sub-surface damage often affects the electrical properties of the material, thereby affecting the performance of the entire device. Therefore, new ultra-precision processing equipment and processing technology need to be developed. To develop the new ultra-precision processing equipment and processing technology, a processing mechanism needs to be understood. Machining is the application of loads to the material. Therefore, the change process and mechanism of the material under the loads need to be researched. Exploration of the change process and mechanism from an atomic scale in a TEM is a very important means. A traditional research method generally observes the material before and after the loads in the TEM, cannot observe the change process of the material under the loads in real time, and thus is difficult to explain the mechanism. Therefore, in recent years, a TEM in-situ nanomechanical testing technique has been developed, which can observe the change process of the material under the loads in real time and can measure the electrical properties of the sample. Therefore, a TEM electromechanical in-situ testing is an important testing method for researching deformation and fracture mechanisms of the material.

One-dimensional materials have unique advantages in the TEM in-situ nanomechanical research. One important reason is that, to observe the microstructure of the material in the TEM, the thickness of the sample must be small enough, and generally is required to be less than 200 nm, while the size of the sample shall be large enough in another dimension and direction to ensure that the sample can be fixed to bear the force. The one-dimensional materials can meet the two requirements without additional processing, thereby avoiding the damage and pollution caused by the processing course. At present, the TEM electromechanical in-situ testing method of the one-dimensional materials is mainly to conduct in-situ tension of the sample in the TEM to observe the change of the electrical properties of the sample in the tension process. The method can only allow the sample to bear a tensile stress. The preparation of the sample is difficult, and needs welding by a focused ion beam (FIB) system. The damage to the sample and Pt pollution in the FIB welding process have important influences on the observation of the mechanical properties, the electrical properties and the microstructure of the sample. Therefore, it is very important to design and develop a method for conducting an electromechanical testing of in-situ compression, buckling and bending experiments of the one-dimensional materials in the TEM and for testing the sample without pollution or damage.

SUMMARY

The present invention designs and manufactures a multi-function sample stage, which can perform in-situ compression, buckling and bending experiments on a sample in a TEM, and can observe the change of the material microstructure of the sample in a stress process and the change of the electrical properties in real time. The present invention also provides a sample preparation method for no damage to the sample, and realizes TEM electromechanical in-situ testing of one-dimensional materials.

The technical solution of the present invention is:

A TEM electromechanical in-situ testing method of one-dimensional materials is provided. A multi-function sample stage is designed and manufactured. A carbon film of a TEM grid of Cu is eliminated, and the TEM grid of Cu is cut in half through the center of the circle. Samples are ultrasonically dispersed in alcohol, and dropped at the edge of a semicircular grid of Cu with a pipette. A single sample is moved from the edge of the semicircular grid of Cu to the edge of the sample stage under an optical microscope or in FIB. The samples are fixed with conductive silver epoxy by using a micromechanical device under the optical microscope, and put in the air for 4-8 hours to solidify the conductive silver epoxy; and then a layer of conductive silver paint is applied to the surface of the sample stage. The present invention provides a simple and efficient sample preparation and testing method for a TEM electromechanical in-situ observing experiment, which can perform compression, buckling and bending experiments on the sample, can observe the change of the material microstructure of the sample in a stress process and the change of the electrical properties in real time, and realize TEM electromechanical in-situ testing of one-dimensional materials.

The samples are one-dimensional materials of nanowires and nanotubes. The one-dimensional materials have large sizes in one dimension, which is convenient for fixing the samples, and have small sizes in other dimensions, which can represent atomic-scale microstructures under a TEM.

The multi-function sample stage is formed by processing an SOI chip through etching and laser stealth cutting methods, is made of boron doped P-type silicon, has overall sizes of 2-3 mm in length, 1.5-2 mm in width and 0.25-0.4 mm in thickness, and is made by processing through the laser stealth cutting method. The multi-function sample stage comprises two parts: an underlayer and a substrate, wherein the substrate has a thickness of 5-15 μm; firstly, a groove with a width of 1.5-1.7 mm and a depth of 30-70 μm is processed from the underlayer through etching; then, a groove with a width of 4-100 μm and a depth of 20-60 μm is etched on the substrate; the samples are fixed on the edge of the substrate perpendicular to the direction of the groove; a ratio of the extending length of the samples from the substrate to the sample diameter is less than 10; a compression experiment is conducted; the samples are fixed on the edge of the substrate perpendicular to the direction of the groove; the ratio of the extending length of the samples from the substrate to the sample diameter is more than 10; a buckling experiment is conducted; the samples are fixed on the edge of the substrate parallel to the direction of the groove; the extending length of the samples from the substrate is more than 2 μm; and a bending experiment is conducted. In order to make the sample stage conductive and convenient in processing, the sample stage is made of the boron-doped P-type silicon, and is processed by processing the SOI chip through the etching and laser stealth cutting methods. Because the pole shoe clearance of the TEM is small, the sample stage must also be small enough to be fixed to an in-situ TEM sample rod. Considering the convenience of the operation process, the overall sizes of the sample stage are selected as 2-3 mm in length and 1.5-2 mm in width. In order to achieve a concentric height of the samples in the TEM, the thickness is selected as 0.25-0.4 mm Due to the small size, the traditional diamond blade cutting method is difficult to process smaller samples due to blade size limitations and easy cracking. The laser stealth cutting method uses a laser beam with a high transmittance to change the single crystal silicon structure to form a starting point for segmentation. Then, the samples are divided into smaller chips by an external force, and the edges of the manufactured chips are smooth and have no cracking phenomenon; thus, the laser stealth cutting method is used. The sample stage is inevitably tilted during processing or installation, causing that the sample to be observed is blocked by the tilted sample stage. To reduce the observation of the sample on the tilted sample stage, the sample stage is divided into two parts: an underlayer and a substrate. A groove with a width of 1.5-1.7 mm and a depth of 30-70 μm is processed from the underlayer through etching; the substrate has a thickness of 5-15 μm; and a groove with a width of 4-100 μm and a depth of 20-60 μm is etched on the substrate. The groove of the substrate is used to realize the functions of compressing, buckling and bending the samples. The samples are fixed on the edge of the substrate perpendicular to the direction of the groove; a ratio of the extending length of the samples from the substrate to the sample diameter is less than 10; a compression experiment is conducted; the samples are fixed on the edge of the substrate perpendicular to the direction of the groove; a ratio of the extending length of the samples from the substrate to the sample diameter is more than 10; the samples can be bent before reaching a compressive stress limit; thus, the buckling experiment can be conducted; the samples are fixed on the edge of the substrate parallel to the direction of the groove, and the bending experiment can be conducted.

A carbon film on a TEM grid of Cu is eliminated, and the TEM grid of Cu is cut in half with a blade through the center of the circle to form a semicircular grid of Cu. The TEM grid of Cu is used as a carrier of the samples. To avoid the interlacing of the carbon film on the surface of the grid of Cu and the samples and facilitate in taking out the single sample from above, the carbon film shall be removed in advance, and can be burned in the air through an inner flame of a lighter or ultrasonically processed for 30 min in an alcohol solution and removed. To distribute more samples on the edge of the grid of Cu and to facilitate the removal of a single sample, the grid of Cu is cut in half with the blade along the center of the circle, and half of the grid of Cu is taken.

The samples are dispersed in an alcoholic solution, and ultrasonically processed for 1-3 min; then, the samples are dropped at the edge of the semicircular grid of Cu with a pipette. Alcohol is an organic solvent which is more commonly used and has good dispersion effect. Thus, the samples are put in the alcoholic solution, and ultrasonically processed for 1-3 min to disperse the samples; and the samples are dropped at the edge of the semicircular grid of Cu with a pipette to facilitate the removal of a single sample from the alcoholic solution.

If the sample diameter is more than 100 nm, a single sample is moved from the edge of the semicircular grid of Cu to the edge of substrate of the sample stage under the optical microscope by using the micromechanical device; if the sample diameter is less than 100 nm, a single sample is moved from the edge of the semicircular grid of Cu to the edge of substrate of the sample stage by using a FIB system. if the sample diameter is more than 100 nm, a single sample can be observed under the optical microscope; thus, the single sample can be moved from the edge of the semicircular grid of Cu to the edge of substrate of the sample stage under the optical microscope by using a micromobile device; if the sample diameter is less than 100 nm, a single sample is difficult to be observed under the optical microscope; thus, the single sample can be moved from the edge of the semicircular grid of Cu to the edge of substrate of the sample stage by using an FIB manipulator.

The samples are fixed with conductive silver epoxy by using a micromechanical device under the optical microscope, and put in the air for 4-8 hours to solidify the conductive silver epoxy; and then a layer of conductive silver paint is applied to the surface of the substrate of the multi-function sample stage. To avoid damage and pollution to the sample during FIB welding, the samples are fixed with the conductive silver epoxy under the optical microscope by using a micromechanical device. Through the conductive silver epoxy, on one hand, it is convenient for dropping and curing time is 4-8 hours to bring sufficient operation time; and on the other hand, the conductive silver epoxy has good conductivity and can conduct the electromechanical testing on the samples through the TEM. After the conductive silver epoxy is solidified, a layer of conductive silver paint is applied to the surface of the substrate of the sample stage to enhance the conductivity of the sample stage.

The sample stage to which the samples are fixed is fixed on a sample holder of the sample rod of the TEM in-situ nanomechanical system by using the conductive silver paint. The conductive silver paint allows the current to pass into the samples from the sample rod.

The sample holder is fixed on the sample rod by screws; and an electromechanical in-situ observing experiment is conducted on the samples under the TEM by using a flat head boron-doped diamond pressing needle or a flat head tungsten pressing needle. The pressing needle is used as the material which comes into contact with the samples. In order to allow the current to pass through the samples, the pressing needle must have good conductivity. At the same time, to compress, buckle or bend the samples, the flat head boron-doped diamond pressing needle or tungsten pressing needle is used to conduct the electromechanical testing on the samples.

The present invention has the effects and benefits that: a multi-function sample stage is designed and manufactured; the samples are fixed through the conductive silver epoxy under the optical microscope by using the micromechanical device, so as to perform compression, buckling and bending experiments on the samples under the TEM and observe the change of the microstructures of the samples and the change of the electrical properties in real time. The TEM electromechanical in-situ testing of one-dimensional materials is realized.

DETAILED DESCRIPTION

Figure 1:
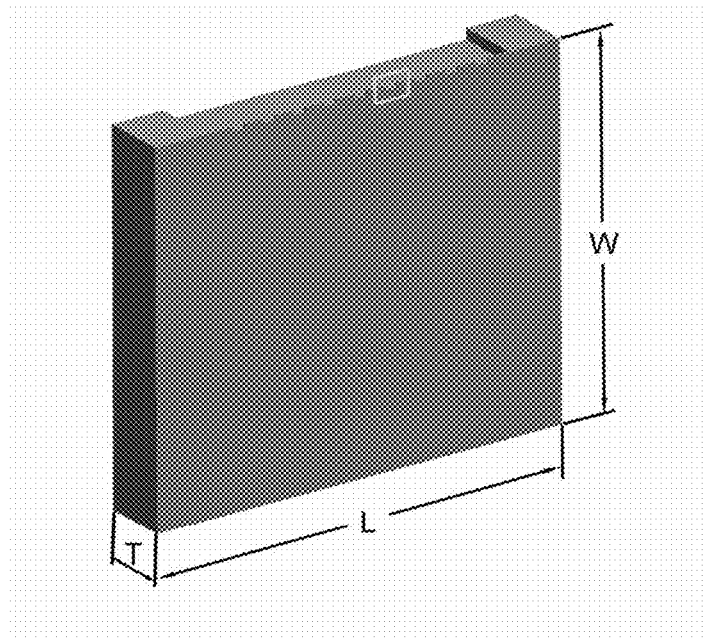
FIG. 1 is a schematic diagram of a designed multi-function sample stage; samples are fixed near a groove on the edge of a substrate of the sample stage to form a cantilever beam shape, as shown in FIG. 2b.
Figures 2A, 2B:
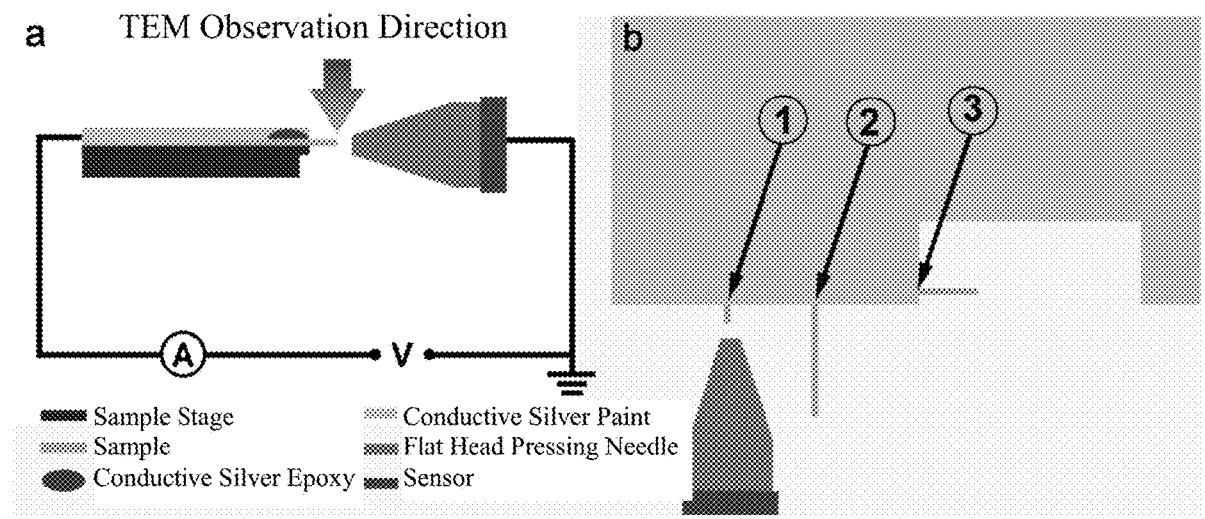
FIG. 2a is a schematic diagram of TEM electromechanical in-situ testing of one-dimensional materials; the sample stage is formed by processing an SOI chip through etching and laser stealth cutting techniques, and is made of boron doped P-type silicon; samples are fixed on the edge of the substrate of the sample stage through conductive silver epoxy to form a cantilever beam shape; then, conductive silver paint is applied to the substrate of the sample stage to enhance the conductivity of the sample stage; when a flat head pressing needle comes into contact with the samples and exerts a load to the samples, a constant voltage can be led; the current passing through the samples, and the change of the current in the strain process of the samples are measured; the flat head pressing needle is fixed on a sensor; and the sensor can measure force and displacement executed by the pressing needle so as to obtain a stress-strain curve of the samples.
FIG. 2b is an enlarged view of the box of FIG. 1; if the sample is fixed on the edge of a substrate perpendicular to the direction of a groove, a ratio of the extending length of the sample from the substrate to the sample diameter is less than 10, e.g., the sample shown in position 1; a compression experiment can be conducted on the sample; if the sample is fixed on the edge of the substrate perpendicular to the direction of the groove, the ratio of the extending length of the sample from the substrate to the sample diameter is more than 10, e.g., the sample shown in position 2; a buckling experiment can be conducted on the sample; if the sample is fixed on the edge of the substrate parallel to the direction of the groove, e.g., the sample shown in position 3, a bending experiment can be conducted on the sample.

Specific embodiments of the present invention are further described below in combination with accompanying drawings and the technical solution.

A TEM electromechanical in-situ testing method of one-dimensional materials is provided. A multi-function sample stage which can compress, buckle and bend samples is designed and manufactured. The samples are fixed with conductive silver epoxy by using a micromechanical device under an optical microscope, and conductive silver paint is applied to the surface of a substrate of the multi-function sample stage; an electromechanical in-situ testing is conducted to the samples under the TEM;

(1) the samples are one-dimensional materials of nanowires and nanotubes;
(2) the multi-function sample stage is formed by processing an SOI chip through etching and laser stealth cutting techniques, is made of boron doped P-type silicon, has overall sizes of 2-3 mm in length, 1.5-2 mm in width and 0.25-0.4 mm in thickness, and is made by processing through the laser stealth cutting technique; the sample stage comprises two parts: an underlayer and a substrate, wherein the substrate has a thickness of 5-15 μm; firstly, a groove with a width of 1.5-1.7 mm and a depth of 30-70 μm is processed from the underlayer through etching; then, a groove with a width of 4-100 μm and a depth of 20-60 μm is etched on the substrate. The samples are fixed on the edge of the substrate perpendicular to the direction of the groove; a ratio of the extending length of the samples from the substrate to the sample diameter is less than 10; a compression experiment is conducted; the samples are fixed on the edge of the substrate perpendicular to the direction of the groove; the ratio of the extending length of the samples from the substrate to the sample diameter is more than 10; a buckling experiment is conducted; the samples are fixed on the edge of the substrate parallel to the direction of the groove; the extending length of the samples from the substrate is more than 2 μm; and a bending experiment is conducted;
(3) a carbon film on a TEM grid of Cu is eliminated, and the TEM grid of Cu is cut in half with a blade through the center of the circle;
(4) the samples are dispersed in an alcoholic solution, and ultrasonically processed for 1-3 min; then, the samples are dropped at the edge of the semicircular grid of Cu with a pipette;
(5) if the sample diameter is more than 100 nm, a single sample is moved from the edge of the semicircular grid of Cu to the edge of substrate of the sample stage under the optical microscope by using the micromechanical device; if the sample diameter is less than 100 nm, a single sample is moved from the edge of the semicircular grid of Cu to the edge of substrate of the sample stage by using a FIB;
(6) the samples are fixed with conductive silver epoxy by using a micromechanical device under the optical microscope, and put in the air for 4-8 hours to solidify the conductive silver epoxy; and then a layer of conductive silver paint is applied to the surface of the substrate of the sample stage to enhance the conductivity of the sample stage;
(7) the sample stage to which the samples are fixed is bonded on a sample holder of the sample rod of the in-situ TEM by using the conductive silver paint;
(8) the sample holder is fixed on the sample rod of the in-situ TEM by screws; and an electromechanical in-situ observing experiment is conducted on the samples under the TEM by using a flat head boron-doped diamond pressing needle or tungsten pressing needle.

Embodiment

The multi-function sample stage is designed and processed; as shown in FIG. 1, the sample stage is formed by processing an SOI chip through etching and laser stealth cutting techniques, is made of boron doped P-type silicon, has overall sizes of 2-2.1 mm in length, 1.7-1.8 mm in width and 0.3-0.31 mm in thickness, and is made by processing through the laser stealth cutting technique; the groove of the underlayer has a width of 1.6-1.7 mm and a depth of 30-40 μm; the groove of the substrate corresponding to the green block has a width of 60-63 μm and a depth of 20-23 μm; and the grooves are made by etching processing.

Figure 3A:
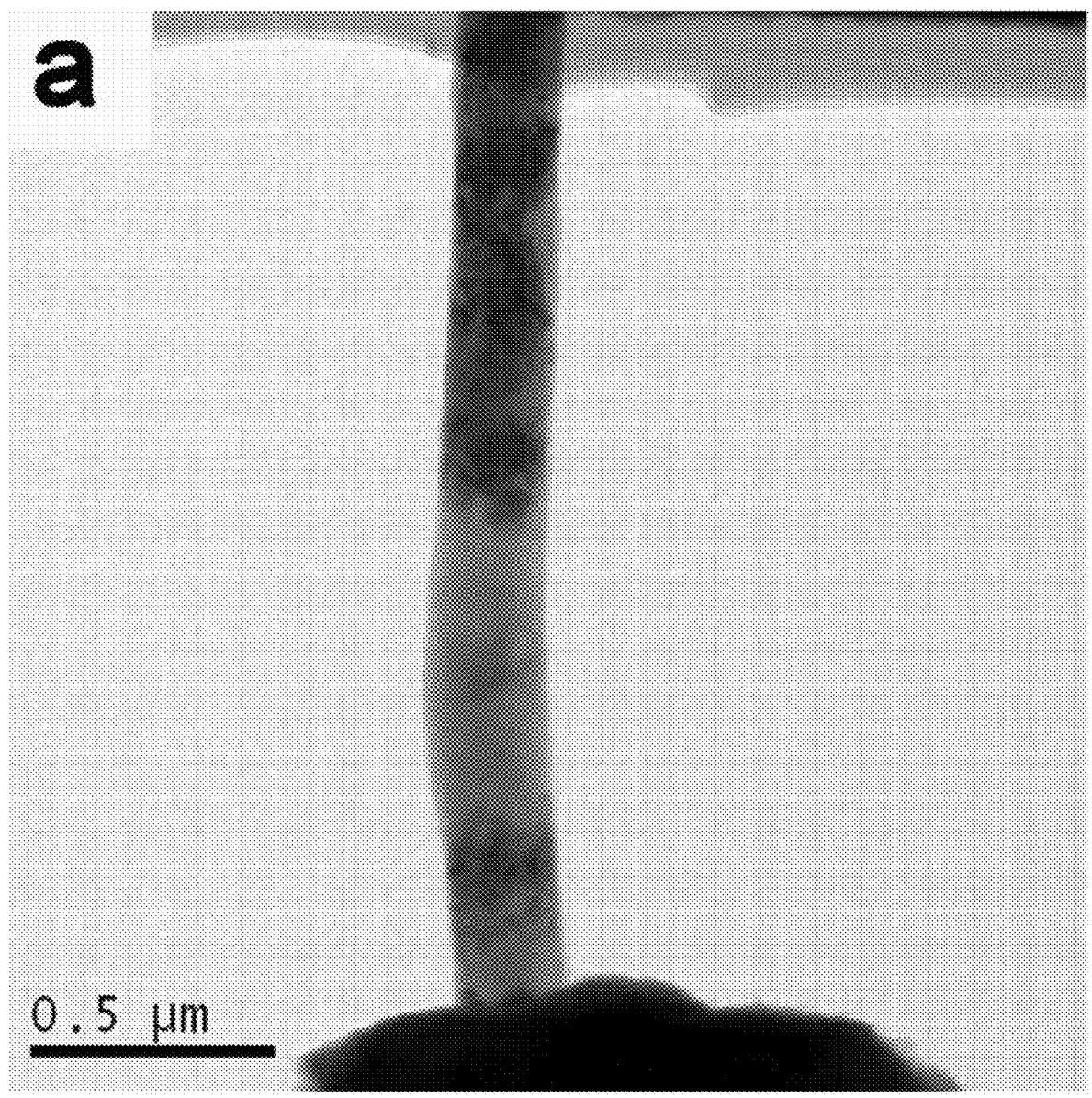
FIG. 3a is a TEM photo of an actual compression testing.
Figure 3B:
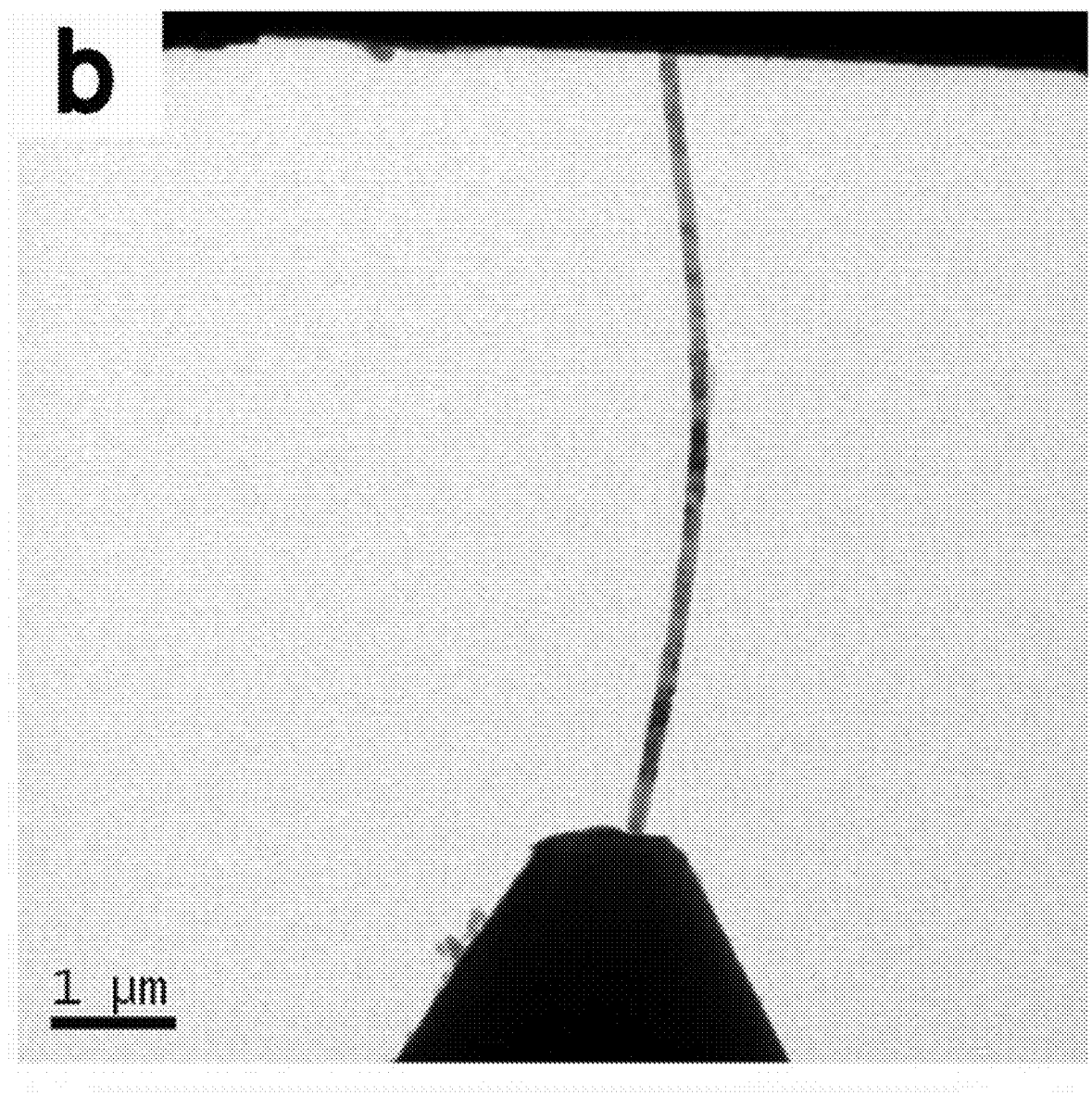
FIG. 3b is a TEM photo of a buckling testing.
Figure 3C:
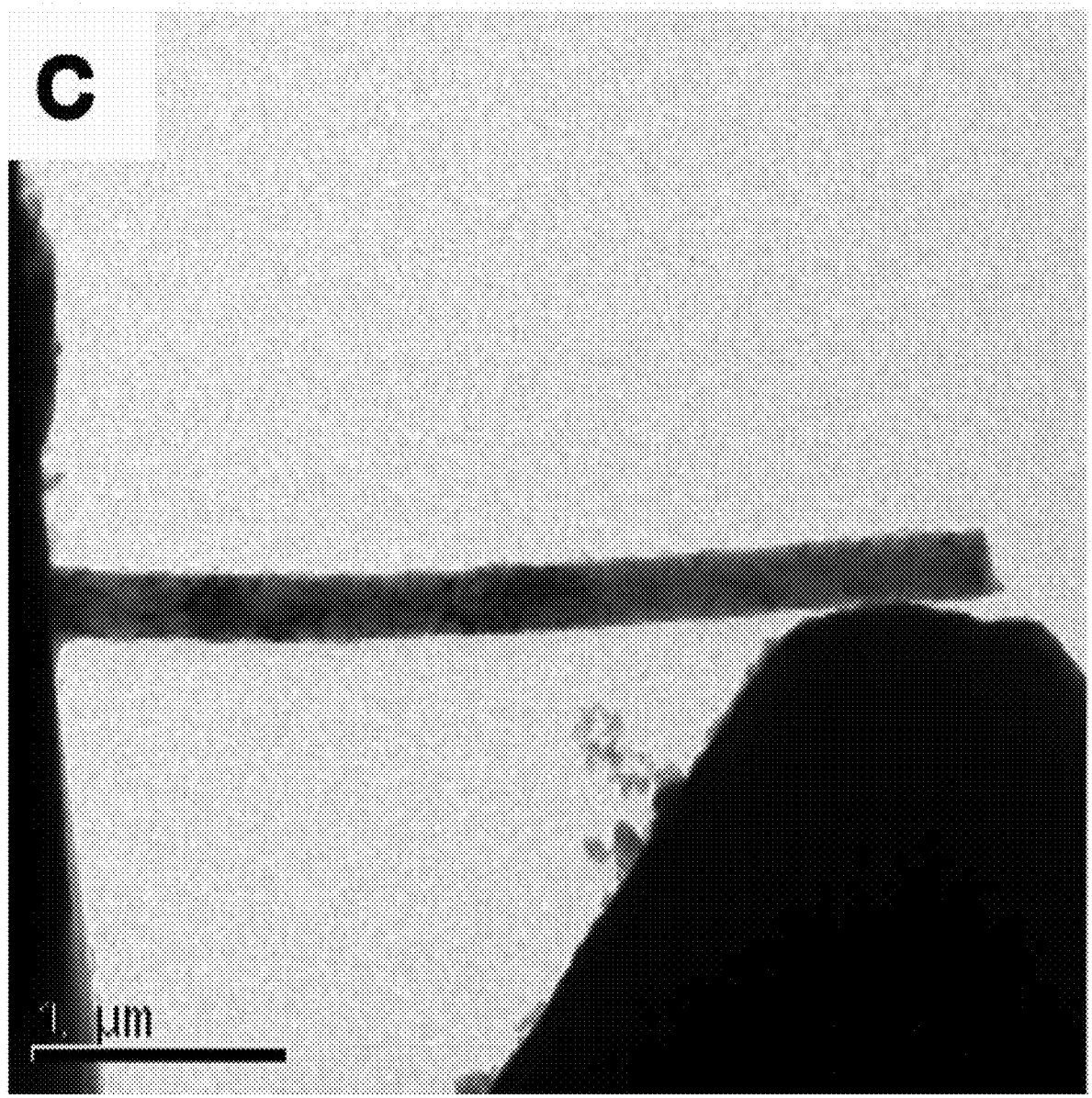
FIG. 3c is a TEM photo of a bending testing process.
Figure 3D:
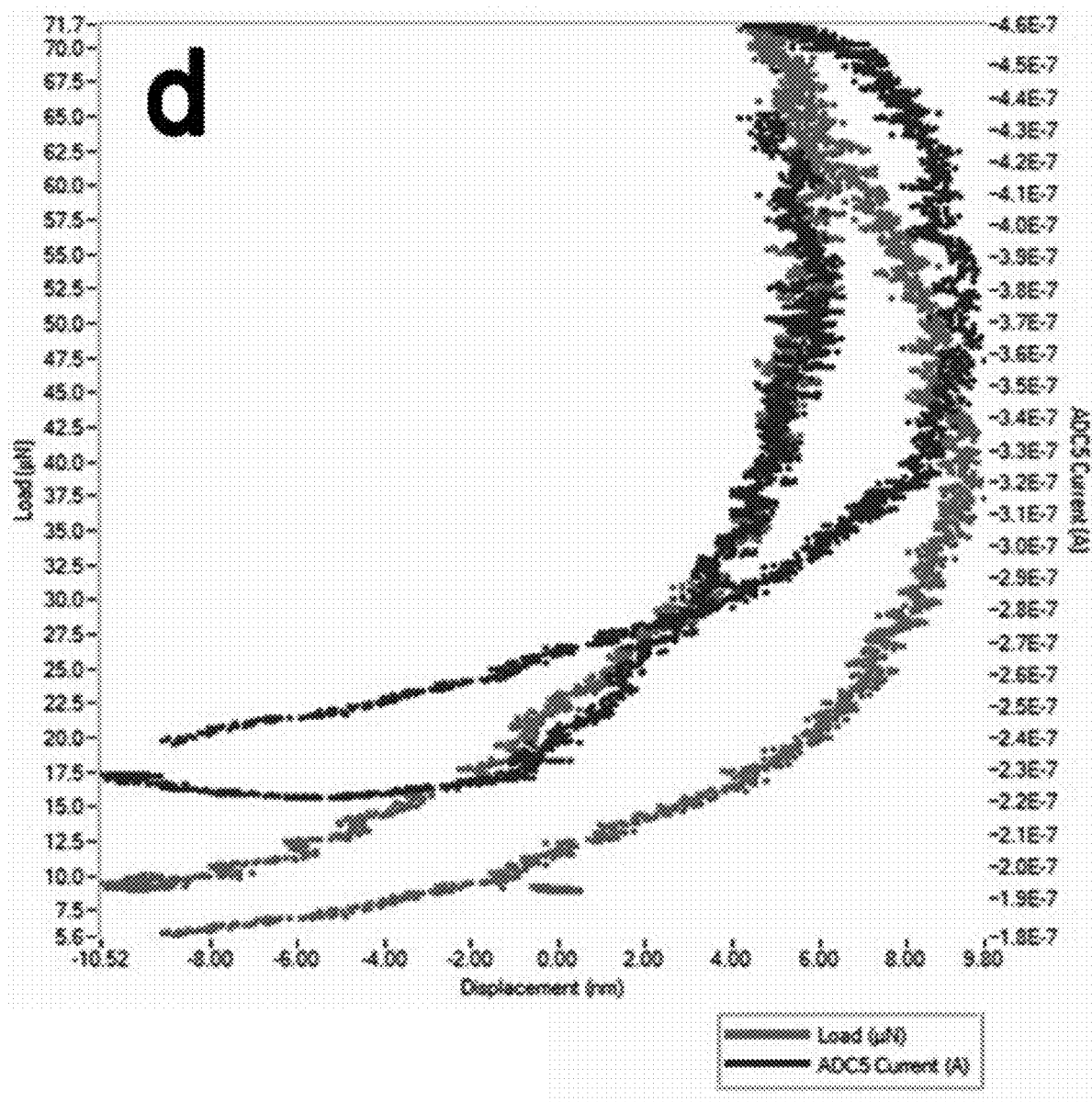
FIG. 3d is a diagram of mechanical information and electrical information of a compression testing.

The carbon film of the TEM grid of Cu is burned off in the air through the inner flame of the lighter, and cut in half with the blade along the center of the grid of Cu. Single crystal 3C—SiC nanowires with a diameter of 100-300 nm and a length of 50-100 μm are selected as the samples. The samples are put in the alcoholic solution, and ultrasonically dispersed for 2 min; and the samples are dropped at the edge of the semicircular TEM grid of Cu with a pipette. A single nanowire is moved from the edge of the semicircular TEM grid of Cu to the edge of the substrate of the sample stage under the optical microscope by using a micromobile device, and is fixed with the conductive silver epoxy. After standing in the air for 5 hours, the conductive silver paint is applied to the surface of the substrate of the sample stage. The sample 1 has a diameter of 239 nm, is fixed to the edge perpendicular to the direction of the groove, has an extending length of 2047 nm from the substrate and can be subjected to the compression experiment. The compression process is shown in FIG. 3a. The sample 2 has a diameter of 145 nm, is fixed to the edge perpendicular to the direction of the groove, has an extending length of 6392 nm from the substrate and can be subjected to the buckling experiment. The buckling process is shown in FIG. 3b. The sample 3 has a diameter of 250 nm, is fixed to the edge parallel to the direction of the groove, has an extending length of 3440 nm from the substrate and can be subjected to the bending experiment. The bending process is shown in FIG. 3c. Microstructural change and the change of electrical properties during sample loading can be obtained in real time during the experiment. FIG. 3d shows a load-displacement curve and a current-displacement curve of the sample in the compression process, wherein the voltage is 10 V and the pressing needle is the flat head boron-doped diamond pressing needle. It can be seen that the larger the load on the sample is, the larger the current passing through the sample is, that is, the better the conductivity of the sample is. The measured piezoresistive coefficient of the sample is $-3\times10^{-10}$ Pa$^{-1}$.

The invention claimed is:

1. A TEM electromechanical in-situ testing method of one-dimensional materials, designing and manufacturing a multi-function sample stage which can compress, buckle and bend samples, wherein the samples are fixed with conductive silver epoxy by using a micromechanical device under an optical microscope, and conductive silver paint is applied to the surface of a substrate of the multi-function sample stage; an electromechanical in-situ testing is conducted to the samples under the TEM, and the change process of the sample microstructures is observed, wherein
   (1) the samples are one-dimensional materials of nanowires and nanotubes;
   (2) the multi-function sample stage is formed by processing an SOI chip through etching and laser stealth cutting methods, is made of boron doped P-type silicon, has overall sizes of 2-3 mm in length, 1.5-2 mm in width and 0.25-0.4 mm in thickness, and is made by processing through the laser stealth cutting method; the multi-function sample stage comprises two parts: an underlayer and a substrate, wherein the substrate has a thickness of 5-15 µm; firstly, a groove with a width of 1.5-1.7 mm and a depth of 30-70 µm is processed from the underlayer through etching; then, a groove with a width of 4-100 µm and a depth of 20-60 µm is etched on the substrate; the samples are fixed on the edge of the substrate perpendicular to the direction of the groove; a ratio of the extending length of the samples from the substrate to the sample diameter is less than 10; a compression experiment is conducted; the samples are fixed on the edge of the substrate perpendicular to the direction of the groove; the ratio of the extending length of the samples from the substrate to the sample diameter is more than 10; a buckling experiment is conducted; the samples are fixed on the edge of the substrate parallel to the direction of the groove; the extending length of the samples from the substrate is more than 2 µm; and a bending experiment is conducted;
   (3) a carbon film on a TEM grid of Cu is eliminated, and the TEM grid of Cu is cut in half with a blade through the center of the circle to form a semicircular grid of Cu;
   (4) the samples are dispersed in an alcoholic solution, and ultrasonically processed for 1-3 min; then, the samples are dropped at the edge of the semicircular grid of Cu with a pipette;
   (5) if the sample diameter is more than 100 nm, a single sample is moved from the edge of the semicircular grid of Cu to the edge of substrate of the sample stage under the optical microscope by using the micromechanical device; if the sample diameter is less than 100 nm, a single sample is moved from the edge of the semicircular grid of Cu to the edge of substrate of the sample stage by using a FIB system;
   (6) the samples are fixed with conductive silver epoxy by using a micromechanical device under the optical microscope, and put in the air for 4-8 hours to solidify the conductive silver epoxy; and then a layer of conductive silver paint is applied to the surface of the substrate of the multi-function sample stage;
   (7) the sample stage to which the samples are fixed is fixed on a sample holder of a sample rod of a TEM in-situ nanomechanical system by using the conductive silver paint;
   (8) the sample holder is fixed on the sample rod by screws; and an electromechanical in-situ observing experiment is conducted on the samples under the TEM by using a flat head boron-doped diamond pressing needle or a flat head tungsten pressing needle.

\* \* \* \* \*